United States Patent
Kim et al.

(10) Patent No.: US 12,046,451 B2
(45) Date of Patent: Jul. 23, 2024

(54) PLASMA ETCHING APPARATUS AND METHOD FOR OPERATING THE SAME

(71) Applicant: Samsung Electronics Co., Ltd., Suwon-si (KR)

(72) Inventors: Nam Kyun Kim, Pyeongtaek-si (KR); Seung Bo Shim, Seoul (KR); Doug Yong Sung, Seoul (KR); Seung Han Baek, Busan (KR); Ju Ho Lee, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 249 days.

(21) Appl. No.: 17/750,653

(22) Filed: May 23, 2022

(65) Prior Publication Data
US 2023/0120474 A1    Apr. 20, 2023

(30) Foreign Application Priority Data
Oct. 18, 2021    (KR) .......................... 10-2021-0138764

(51) Int. Cl.
*H01J 37/32*    (2006.01)
*H01L 21/3065*    (2006.01)

(52) U.S. Cl.
CPC .. *H01J 37/32165* (2013.01); *H01J 37/32183* (2013.01); *H01J 37/32577* (2013.01); *H01J 37/32715* (2013.01); *H01L 21/3065* (2013.01)

(58) Field of Classification Search
None
See application file for complete search history.

(56) References Cited

U.S. PATENT DOCUMENTS

| | | | |
|---|---|---|---|
| 7,988,874 B2 | 8/2011 | Lee et al. | |
| 8,574,446 B2 * | 11/2013 | Morimoto | H01J 37/32082 156/345.47 |
| 8,735,291 B2 | 5/2014 | Ranjan et al. | |
| 9,111,999 B2 | 8/2015 | Radwan et al. | |
| 9,741,539 B2 | 8/2017 | Kawasaki et al. | |
| 10,998,169 B2 | 5/2021 | Ventzek et al. | |
| 2013/0020027 A1 | 1/2013 | Kamijo | |

(Continued)

FOREIGN PATENT DOCUMENTS

DE    102011004581 A1    8/2012
KR    101842756 B1    3/2018

*Primary Examiner* — Allan W. Olsen
(74) *Attorney, Agent, or Firm* — HARNESS, DICKEY & PIERCE, P.L.C.

(57) ABSTRACT

A plasma etching apparatus may include a first source electrode, a first bias electrode, and a second bias electrode configured to generate a plasma by supplying energy to a process gas injected into a chamber; and a controller. The controller may be configured to supply a first high-frequency RF power, a first low-frequency RF power, and a second low-frequency RF power to the chamber during a first period from a first time to a second time; ramp down and turn off the first high-frequency RF power to the chamber during a second period from the second time to a third time; and ramp down and turn off the first low-frequency RF power to the chamber during a third period from the second time to a fourth time different from the third time. The third period may be smaller than ½ of the first period and greater than the second period.

20 Claims, 12 Drawing Sheets

(56) References Cited

U.S. PATENT DOCUMENTS

| | | | |
|---|---|---|---|
| 2015/0122420 A1* | 5/2015 | Konno | H01J 37/32926 |
| | | | 156/345.28 |
| 2019/0006150 A1* | 1/2019 | Shim | H01J 37/32183 |
| 2020/0227289 A1* | 7/2020 | Song | H01J 37/3211 |
| 2021/0296093 A1* | 9/2021 | Koshimizu | H01J 37/32706 |

* cited by examiner

FIG. 4

| P3 (μsec) | 0 | 30 | 50 |
|---|---|---|---|
| Aspect Ratio | 49.8 | 52.1 | 57.1 |

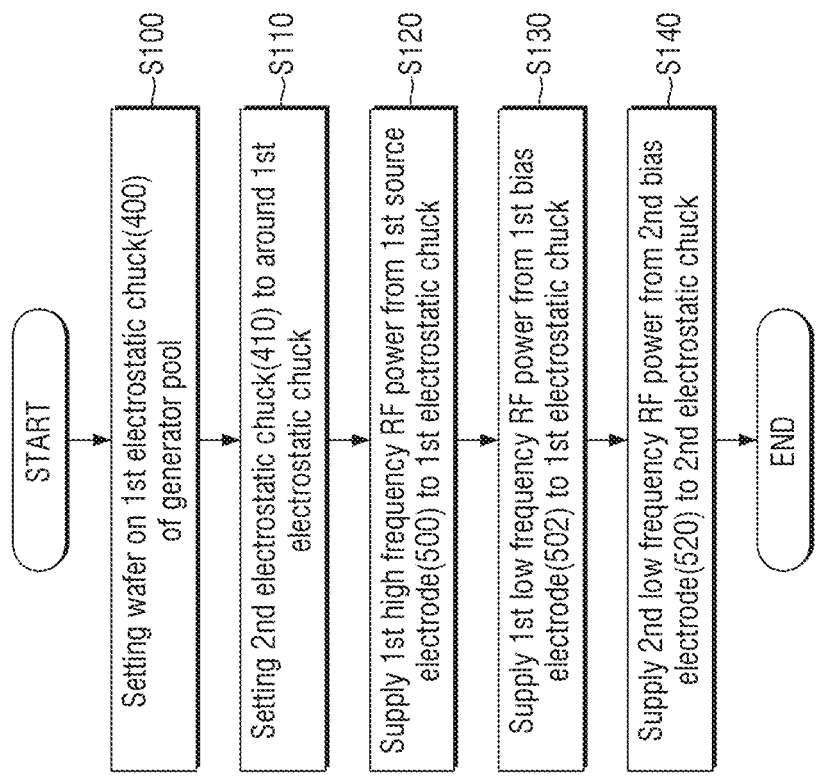

PLASMA ETCHING APPARATUS AND METHOD FOR OPERATING THE SAME

CROSS-REFERENCE TO RELATED APPLICATION

This application claims priority from Korean Patent Application No. 10-2021-0138764, filed on Oct. 18, 2021 in the Korean Intellectual Property Office, and all the benefits accruing therefrom under 35 U.S.C. 119, the entire contents of which are herein incorporated by reference.

BACKGROUND

Field

The present disclosure relates to a plasma etching apparatus and/or a method for operating the same.

Description of Related Art

With development of a semiconductor element, such as V-NAND included in a semiconductor device such as SSD, an etching process that satisfies HAR (High Aspect Ratio) of 1:100 or greater may be required.

Etching a substrate using a plasma etching apparatus may employ RF (radio frequency) powers respectively having multiple frequencies.

SUMMARY

Embodiments of the present disclosure provide a plasma etching apparatus with improved substrate etching performance.

Embodiments of the present disclosure provide a plasma etching apparatus that independently controls RF powers having multiple frequencies.

Embodiments of the present disclosure also provide a method for operating a plasma etching apparatus with improved substrate etching performance.

Features and effects according to the present disclosure are not limited to those discussed above. Other features, effects, and advantages according to the present disclosure that are not mentioned may be understood based on following descriptions, and may be more clearly understood based on embodiments according to the present disclosure. Further, it will be easily understood that features, effects, and advantages of embodiments in the present disclosure may be realized using means shown in the claims and combinations thereof.

According to an embodiment of inventive concepts, a plasma etching apparatus may include a first electrostatic chuck configured to support a substrate; a second electrostatic chuck around an edge of the first electrostatic chuck and surrounding the first electrostatic chuck; a first source electrode electrically connected to the first electrostatic chuck and configured to supply a first high-frequency RF power thereto; a first bias electrode electrically connected to the first electrostatic chuck and configured to supply a first low-frequency RF power thereto, wherein a frequency of the first low-frequency RF power may be lower than a frequency of the first high-frequency RF power; a second bias electrode electrically connected to the second electrostatic chuck and configured to supply a second low-frequency RF power thereto, wherein a frequency of the second low-frequency RF power may be lower than the frequency of the first high-frequency RF power; and a controller configured to control the first source electrode, the first bias electrode, and the second bias electrode. The controller may be configured to supply the first high-frequency RF power to the first source electrode, the first low-frequency RF power to the first bias electrode, and the second low-frequency RF power to the second bias electrode during a first period from a first time to a second time. The controller may be configured to ramp down and turn off the first high-frequency RF power to the first source electrode during a second period from the second time to a third time. The controller may be configured to ramp down and turn off the first low-frequency RF power to the first bias electrode during a third period from the second time to a fourth time different from the third time. The second time may be after the first time. The third time may be after the second time. The fourth time may be after the third time. The third period may be smaller than ½ times the first period. The third period may be larger than the second period.

According to an embodiment of inventive concepts, a plasma etching apparatus may include a chamber having an internal space defined therein; a first source electrode, a first bias electrode, and a second bias electrode configured to generate a plasma by supplying energy to a process gas injected into the internal space of the chamber; and a controller. The controller may be configured to control a first high-frequency RF power supplied from the first source electrode to the chamber, a first low-frequency RF power supplied from the first bias electrode to the chamber and having a frequency that is lower than a frequency of the first high-frequency RF power, and a second low-frequency RF power supplied from the second bias electrode to chamber and having a frequency that is lower than the frequency of the first high-frequency RF power. The controller may be configured to supply the first high-frequency RF power, the first low-frequency RF power, and the second low-frequency RF power to the chamber during a first period from a first time to a second time. The controller may be configured to ramp down and turn off the first high-frequency RF power to the chamber during a second period from the second time to a third time. The controller may be configured to ramp down and turn off the first low-frequency RF power to the chamber during a third period from the second time to a fourth time different from the third time. The second time may be after the first time. The third time may be after the second time. The fourth time may be after the third time. The third period may be smaller than ½ times the first period. The third period may be greater than the second period.

According to an embodiment of inventive concepts, a method for operating a plasma etching apparatus may include placing a second electrostatic chuck around an edge of the first electrostatic chuck so the second electrostatic chuck surrounds the first electrostatic chuck; supplying a first high-frequency RF power to the first electrostatic chuck via a first source electrode electrically connected to the first electrostatic chuck; supplying a first low-frequency RF power via a first bias electrode electrically connected to the first electrostatic chuck, wherein a frequency of the first low-frequency RF power may be lower than a frequency of the first high-frequency RF power; supplying a second low-frequency RF power to the second electrostatic chuck via a second bias electrode electrically connected to the second electrostatic chuck, wherein a frequency of the second low-frequency RF power may be lower than the frequency of the first high-frequency RF power; and controlling, by a controller, the first source electrode, the first bias electrode, and the second bias electrode. The controller may control the first source electrode, the first bias electrode, and the second bias electrode such that the first high-frequency RF power is supplied to the first source electrode, the first low-frequency RF power is supplied to the first bias electrode, and the second low-frequency RF power is supplied to the second bias electrode during a first period from a first time to a second time; the first high-frequency RF power to the first source electrode is ramped down and turned off during a second period from the second time to a third time; and the first low-frequency RF power to the first bias electrode is ramped down and turned off during a third period from the second time to a fourth time different from the third time. The second time may be after the first time. The third time may be after the second time. The fourth time may be after the third time. The third period may be smaller than ½ times the first period, and the third period may be greater than the second period.

Specific details of other embodiments are included in detailed descriptions and drawings.

BRIEF DESCRIPTION OF DRAWINGS

The above and other aspects and features of the present disclosure will become more apparent by describing in detail embodiments thereof with reference to the attached drawings, in which:

FIG. 4 and FIG. 5 are example tables of comparing process results under operations of the plasma etching apparatus according to some embodiments.

FIG. 12 is an example flowchart for illustrating a method for operating a plasma etching apparatus according to some embodiments.

DETAILED DESCRIPTIONS

Figure 1:
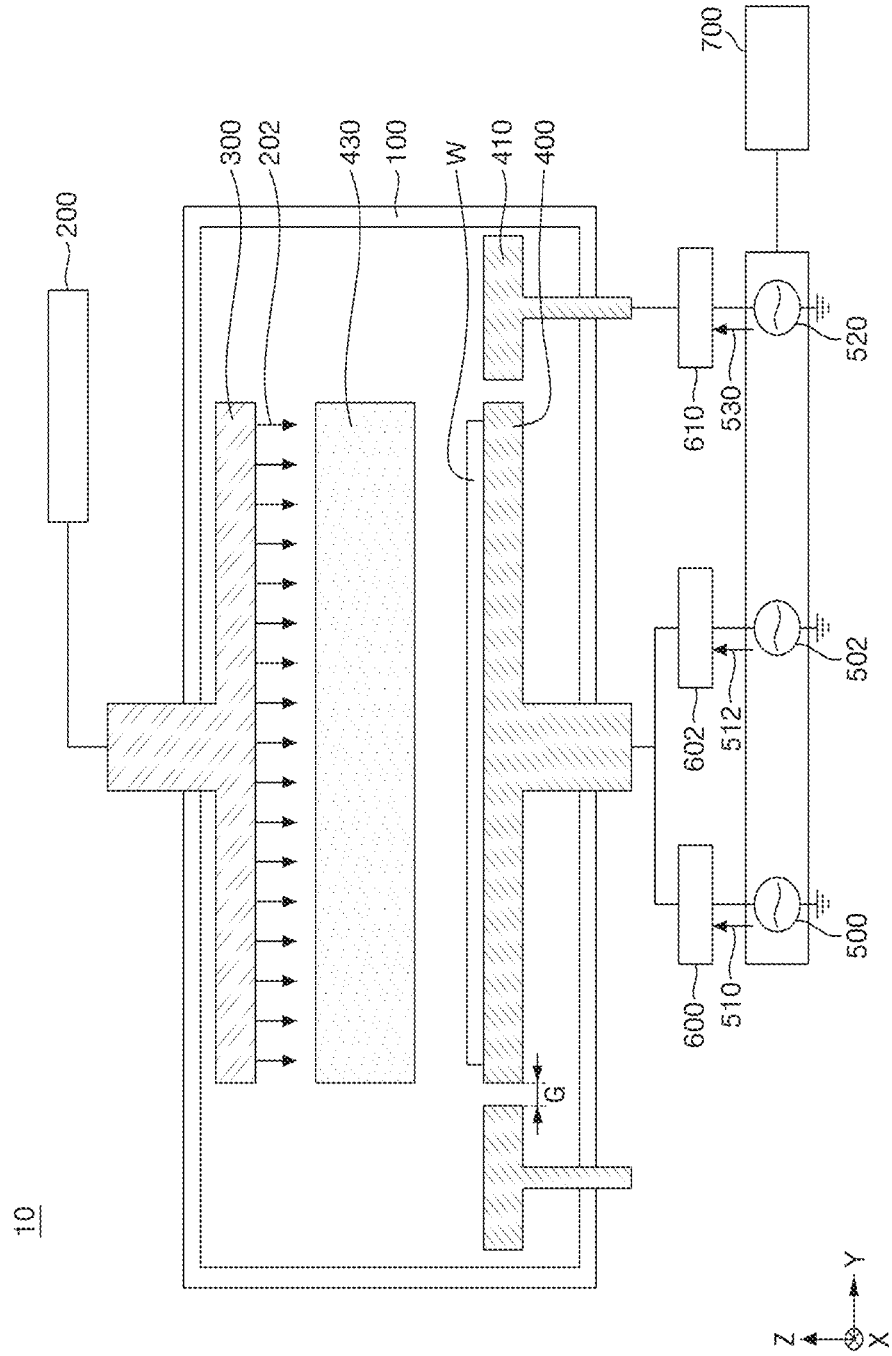
FIG. 1 is an example diagram for illustrating a plasma etching apparatus according to some embodiments.

For simplicity and clarity of illustration, elements in the drawings are not necessarily drawn to scale. The same reference numbers in different drawings represent the same or similar elements, and as such perform similar functionality. Further, descriptions and details of well-known steps and elements may be omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for illustrating embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between and connected to the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between and connected to the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between and connected to the former and the latter. Further, as used herein, when a layer, film, region, plate, or the like may be disposed "below" or "under" another layer, film, region, plate, or the like, the former may directly contact the latter or still another layer, film, region, plate, or the like may be disposed between and connected to the former and the latter. As used herein, when a layer, film, region, plate, or the like is directly disposed "below" or "under" another layer, film, region, plate, or the like, the former directly contacts the latter and still another layer, film, region, plate, or the like is not disposed between and connected to the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated. The features of the various embodiments of the present disclosure may be partially or entirely combined with each other, and may be technically associated with each other or operate with each other. The embodiments may be implemented independently of each other and may be implemented together in an association relationship. Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented for example, rotated 90 degrees or at other orientations, and the spatially relative descriptors used herein should be interpreted accordingly.

FIG. 1 is an example diagram for illustrating a plasma etching apparatus according to some embodiments.

Referring to FIG. 1, a plasma etching apparatus 10 according to some embodiments may be embodied as, for example, a capacitively coupled plasma etching apparatus.

The plasma etching apparatus 10 according to some embodiments may include a chamber 100, a gas supply device 200 (e.g., canister with conduit connecting canister to chamber and valve for regulating flow rate), a showerhead 300, a first electrostatic chuck 400, a second electrostatic chuck 410, a first source electrode 500, a first bias electrode 502, a second bias electrode 520, a first RF matcher 600, a second RF matcher 602, a third RF matcher 610, and a controller 700.

The chamber 100 may have a semiconductor device manufacturing space defined therein in which a plasma etching process is performed using the plasma etching apparatus 10. That is, the chamber 100 may have a sealed space of a desired and/or alternatively predetermined size defined therein. The chamber 100 may be formed in various shapes depending on a size of a substrate W, etc. For example, the chamber 100 may have a cylindrical shape corresponding to the disk-shaped substrate W. However, the shape of the chamber 100 is not limited thereto.

The gas supply device 200 may be disposed outside the chamber 100. The gas supply device 200 may supply process gas 202 into the chamber 100. For example, the process gas 202 may include at least one of $CF_4$, $C_4F_6$, $C_4F_8$, COS, $CHF_3$, HBr, $SiCl_4$, $O_2$, $N_2$, $H_2$, $NF_3$, $SF_6$, He, or Ar. However, a type of the process gas is not limited thereto.

The showerhead 300 may be disposed at a top of the chamber 100 in a third direction z. The showerhead 300 may be connected to the gas supply device 200. The showerhead 300 may supply the process gas 202 onto the substrate W.

The first electrostatic chuck 400 and the second electrostatic chuck 410 may be disposed at a bottom of the chamber 100. The substrate W may be disposed on the first electrostatic chuck 400. The first electrostatic chuck 400 may fix the substrate W to the first electrostatic chuck 400 using an electro-static voltage.

The second electrostatic chuck 410 may be disposed around an edge of the first electrostatic chuck 400 and surround the first electrostatic chuck 400. For example, the second electrostatic chuck 410 may be spaced apart from the first electrostatic chuck 400 by a spacing G.

An arrangement of the first electrostatic chuck 400 and the second electrostatic chuck 410 will be described with reference to a top view of FIG. 2.

Figure 2:
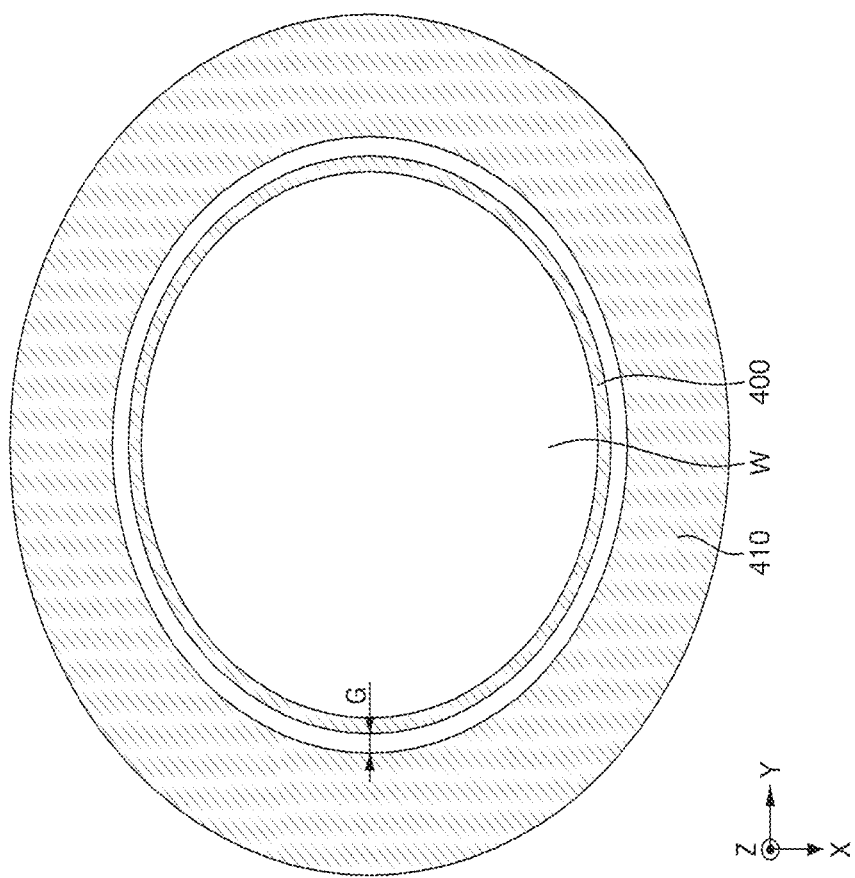
FIG. 2 is an example top view of a portion of the plasma etching apparatus according to some embodiments.

FIG. 2 is an example top view of a portion of the plasma etching apparatus according to some embodiments.

Referring to FIG. 2, the second electrostatic chuck 410 may be disposed around the edge of the first electrostatic chuck 400 and surround the first electrostatic chuck 400. For example, the second electrostatic chuck 410 may be spaced apart from the first electrostatic chuck 400 by the spacing G. The substrate W may be disposed on the first electrostatic chuck 400.

Referring back to FIG. 1, the first source electrode 500, the first bias electrode 502, and the second bias electrode 520 may be disposed outside the chamber 100. The first source electrode 500, the first bias electrode 502, and the second bias electrode 520 may be disposed outside the chamber 100 may include power supply circuitry.

The first source electrode 500 and the first bias electrode 502 may be electrically connected to the first electrostatic chuck 400. The second bias electrode 520 may be electrically connected to the second electrostatic chuck 410.

The first source electrode 500 and the first bias electrode 502 may supply RF (Radio Frequency) power to the first electrostatic chuck 400. The second bias electrode 520 may supply RF power to the second electrostatic chuck 410.

For example, the first source electrode 500 and the first bias electrode 502 may supply the RF power of a pulse waveform to the first electrostatic chuck 400. The second bias electrode 520 may supply the RF power of a pulse waveform to the second electrostatic chuck 410.

The first source electrode 500 and the first bias electrode 502 may supply the RF power to the first electrostatic chuck 400 to allow plasma 430 to be generated on the substrate W. More specifically, the first source electrode 500 may generate a first high-frequency RF power 510, while the first bias electrode 502 may generate a first low-frequency RF power 512 having a lower frequency than that of the first high-frequency RF power.

The first source electrode 500 may supply the first high-frequency RF power 510 to the first electrostatic chuck 400 to generate the plasma 430 on the substrate W. A frequency of the first high-frequency RF power 510 may be about 60 MHz. Alternatively, the frequency of the first high-frequency RF power 510 may be an VHF (Very High Frequency) in a range of 60 MHz to several hundred MHz.

The first bias electrode 502 may apply the first low-frequency RF power 512 to the first electrostatic chuck 400 such that the plasma 430 generated on the substrate W may be distributed on the substrate W in a concentrated manner. The frequency of the first low-frequency RF power 512 is lower than that of the first high-frequency RF power 510. For example, the frequency of the first low-frequency RF power 512 may be about 400 kHz. Alternatively, the frequency of the first low-frequency RF power 512 may be a low-frequency (LF) in a range of 0.1 MHz to 13.56 MHz.

The second bias electrode 520 may apply a second low-frequency RF power 530 to the second electrostatic chuck 410 such that the plasma 430 generated on the substrate W may be distributed on the substrate W in a concentrated manner. A frequency of the second low-frequency RF power 530 is lower than that of the first high-frequency RF power 510. For example, the frequency of the second low-frequency RF power 530 may be about 400 kHz. Alternatively, the frequency of the second low-frequency RF power 530 may be a low-frequency in a range of 0.1 MHz to 13.56 MHz.

The first RF matcher 600 may be disposed between and connected to the first electrostatic chuck 400 and the first source electrode 500. The second RF matcher 602 may be disposed between and connected to the first electrostatic chuck 400 and the first bias electrode 502. The third RF matcher 610 may be disposed between and connected to the second electrostatic chuck 410 and the second bias electrode 520.

The first RF matcher 600 may detect reflective power from the first electrostatic chuck 400, may match impedance of the first high-frequency RF power 510 with that of the plasma 430 in the chamber 100 to remove the reflective power from the first electrostatic chuck 400. The impedance of the plasma 430 may include impedances of the chamber 100, the first electrostatic chuck 400, and a connecting cable (not shown) connecting the chamber 100 and the first electrostatic chuck 400 to each other. When the impedance of the first high-frequency RF power 510 and the impedance of the plasma 430 match each other, generating efficiency of the plasma 430 may be increased to a maximum level without loss of the first high-frequency RF power 510.

The second RF matcher 602 may sense reflective power from the first electrostatic chuck 400, and may match impedance of the first low-frequency RF power 512 with that of the plasma 430 in the chamber 100 to remove the reflective power from the first electrostatic chuck 400. The impedance of plasma 430 may include impedances of the chamber 100, the first electrostatic chuck 400, and the connecting cable (not shown) connecting the chamber 100 and the first electrostatic chuck 400 to each other. When the impedance of the first low-frequency RF power 512 and the impedance of the plasma 430 match each other, the generating efficiency of the plasma 430 may be increased to the maximum level without loss of the first low-frequency RF power 512.

The third RF matcher 610 may detect reflective power from the second electrostatic chuck 410, and may match impedance of the second low-frequency RF power 530 with that of the plasma 430 in the chamber 100 to remove the reflective power from the second electrostatic chuck 410. The impedance of the plasma 430 may include impedances of the chamber 100, the second electrostatic chuck 410, and a connecting cable (not shown) connecting the chamber 100 and the second electrostatic chuck 410 to each other. When the impedance of the second low-frequency RF power 530 and the impedance of the plasma 430 match each other, the generating efficiency of the plasma 430 may be increased to the maximum level without loss of the second low-frequency RF power 530.

The controller 700 may control the first source electrode 500, the first bias electrode 502, and the second bias electrode 520. More specifically, the controller 700 may control on or off of the first high-frequency RF power 510 generated from the first source electrode 500, may control on or off of the first low-frequency RF power 512 generated from the first bias electrode 502, and may control on or off of the second low-frequency RF power 530 generated from the second bias electrode 520.

That is, the controller 700 of the plasma etching apparatus 10 according to some embodiments may independently control on or off of the first high-frequency RF power 510, on or off of the first low-frequency RF power 512, and on or off of the second low-frequency RF power 530 such that in a process of manufacturing a semiconductor device on the substrate W, etching performance may be controlled in a desired direction. For example, the etching performance in the process of manufacturing the semiconductor device on the substrate W may be improved to perform an etching process with an improved aspect ratio.

An operation in which the controller 700 of the plasma etching apparatus 10 according to some embodiments independently controls on or off of the first high-frequency RF power 510, on or off of the first low-frequency RF power 512, and on or off of the second low-frequency RF power 530 will be described with reference to FIG. 3.

Figure 3:
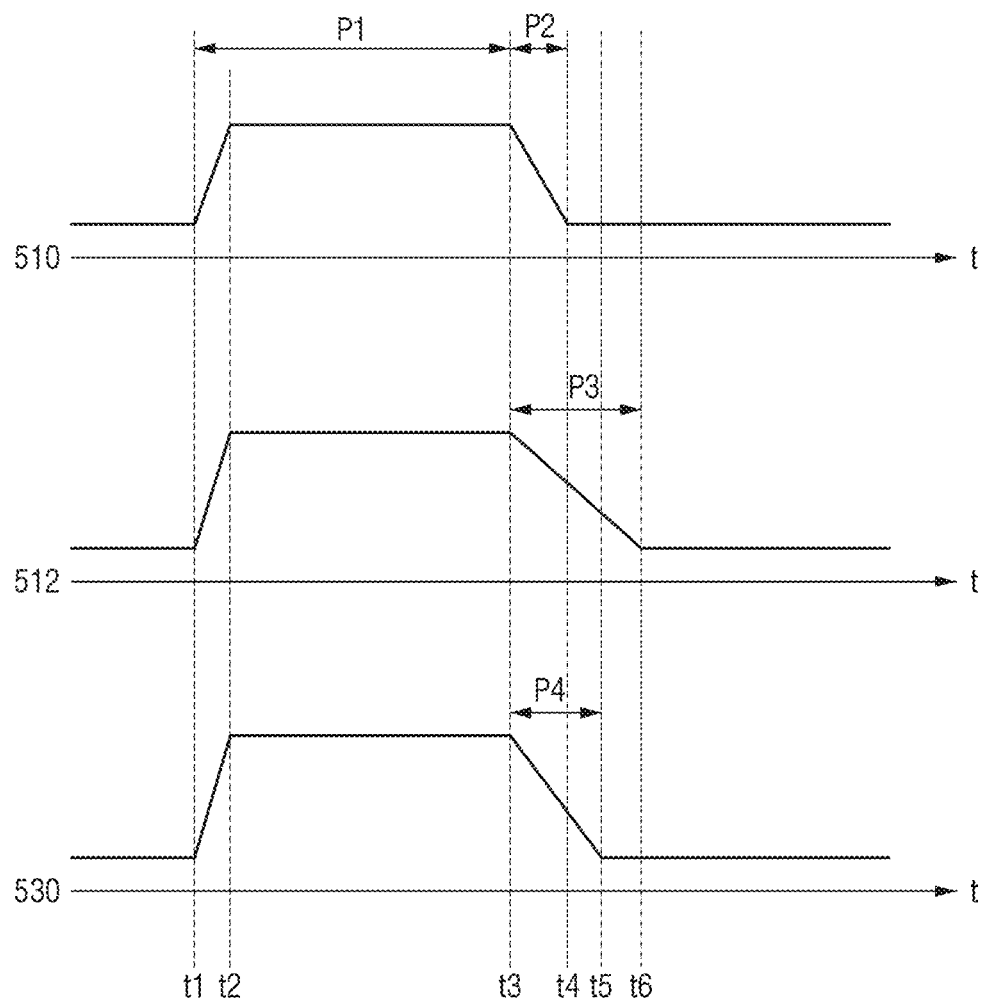
FIG. 3 is an example timing diagram for illustrating an operation of the plasma etching apparatus according to some embodiments.
Figure 4:
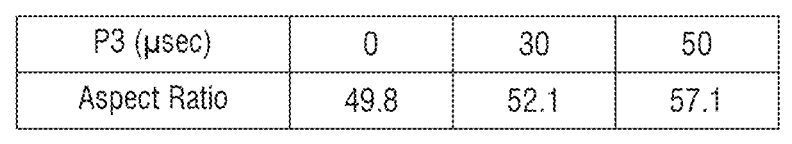
Figure 5:
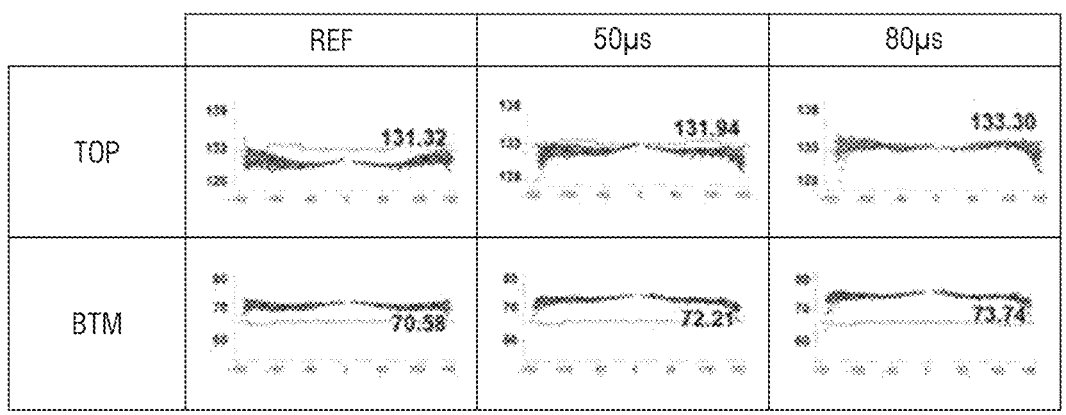

FIG. 3 is an example timing diagram for illustrating an operation of the plasma etching apparatus according to some embodiments. FIG. 4 and FIG. 5 are example tables of comparing process results under operations of the plasma etching apparatus according to some embodiments with each other.

Referring to FIG. 1 and FIG. 3, the controller 700 may independently control on/off the first high-frequency RF power 510, on/off of the first low-frequency RF power 512, and on/off of the second low-frequency RF power 530.

For example, a case will be described in which it is assumed that an etch rate of the plasma etching apparatus 10 according to some embodiments needs to be increased.

The controller 700 may start to turn on the first high-frequency RF power 510, the first low-frequency RF power 512, and the second low-frequency RF power 530 at a first time t1. The controller may ramp up the first high-frequency RF power 510, the first low-frequency RF power 512, and the second low-frequency RF power 530 until a timing reaches a second time t2 having a delay of a desired and/or alternatively predetermined time from the first time. Thereafter, the turned-on state of each of the first high-frequency RF power 510, the first low-frequency RF power 512, and the second low-frequency RF power 530 may be maintained until a timing reaches a third time t3.

A duration from the first time t1 to the third time t3 for which the first high-frequency RF power 510, the first low-frequency RF power 512, and the second low-frequency RF power 530 are turned on may be defined as a first period P1.

Thereafter, the controller 700 may turn off the first high-frequency RF power 510 for a duration from the third time t3 to a fourth time t4. More specifically, the controller 700 ramps down the first high-frequency RF power 510 for the duration from the third time t3 to the fourth time t4. The duration from the third time t3 to the fourth time t4 for which the controller 700 ramps down the first high-frequency RF power 510 may be defined as a second period P2.

In this connection, the controller 700 may turn off the first low-frequency RF power 512 for a duration from the third time t3 to a sixth time t6. More specifically, the controller 700 ramps down the first low-frequency RF power 512 for the duration from the third time t3 to the sixth time t6. The sixth time t6 is subsequent to the fourth time t4. The duration from the third time t3 to the sixth time t6 for which the controller 700 ramps down the first low-frequency RF power 512 may be defined as a third period P3.

The third period P3 is greater than the second period P2 and is smaller than half of the first period P1. This relationship may be expressed by a following relationship (1).

$$P1*0.5>P3>P2 \quad \text{Relationship (1)}$$

Referring to FIG. 3 and FIG. 4, it is assumed that the first high-frequency RF power 510 has, for example, a frequency of 1.5 kHz, and the first low-frequency RF power 512 has, for example, a frequency of 400 kHz. In this connection, it is assumed that the first period P1 is 126 us.

Based on the table in FIG. 4, it may be identified that when the third period P3 is 0 us, the aspect ratio is 49.8; when the third period P3 is 30 us, the aspect ratio is 52.1; and when the third period P3 is 50 us, the aspect ratio is 57.1

That is, as the time period P3 for which the first low-frequency RF power 512 is ramped down is larger than the time period P2 for which the first high-frequency RF power 510 is ramped down, the aspect ratio may be further improved.

Referring to FIG. 3 and FIG. 5, it is assumed that the first high-frequency RF power 510 has a frequency of 1.5 kHz, and the first low-frequency RF power 512 has a frequency of 400 kHz. In this connection, it is assumed that the first period P1 is 126 us.

The table in FIG. 5 shows a line width distribution graph of each of a top TOP and a bottom BTM of the substrate formed during the process when the third period P3 is 30 us as a reference REF. Further, the table in FIG. 5 shows a line width distribution graph of each of a top TOP and a bottom BTM of the substrate formed during the process when the third period P3 is 50 us. Further, the table in FIG. 5 shows a line width distribution graph of each of a top TOP and a bottom BTM of the substrate formed during the process when the third period P3 80 us.

In this connection, when the third period P3 is 30 us, an average line width of the top TOP of the substrate formed during the process is 131.32 nm, and the average linewidth of the bottom BTM thereof is 70.58 nm. Further, when the third period P3 is 50 us, the average line width of the top TOP of the substrate formed during the process is 131.94 nm, and the average line width of the bottom BTM thereof is 72.21 nm. Further, when the third period P3 is 80 us, the average line width of the top TOP of the substrate formed during the process is 133.30 nm, and the average line width of the bottom BTM thereof is 73.74 nm.

As the third period P3 increases from 30 us to 50 us, the line width distribution of each of the top TOP and the bottom BTM of the substrate formed during the process is centered on the average line width. However, when the third period P3 becomes greater than 0.5 times of the first period P1, for example, when the third period P3 is 80 us, the line width distribution of each of the top TOP and the bottom BTM of the substrate formed during the process is not centered on the average line width.

Accordingly, based on the above Relationship 1, when the third period P3 has a range greater than the second period P2 and smaller than the half of the first period P1, the etching efficiency of the plasma etching apparatus according to some embodiments may be improved.

The plasma etching apparatus 10 according to some embodiments independently controls the time periods for which the first high-frequency RF power 510, the first low-frequency RF power 512, and the second low-frequency RF power 530 having different frequencies are ramped down, respectively, thereby limiting and/or preventing clogging that may otherwise occur during the etching process. This will be described at in detail with reference to FIG. 6 and FIG. 7.

Figure 6:
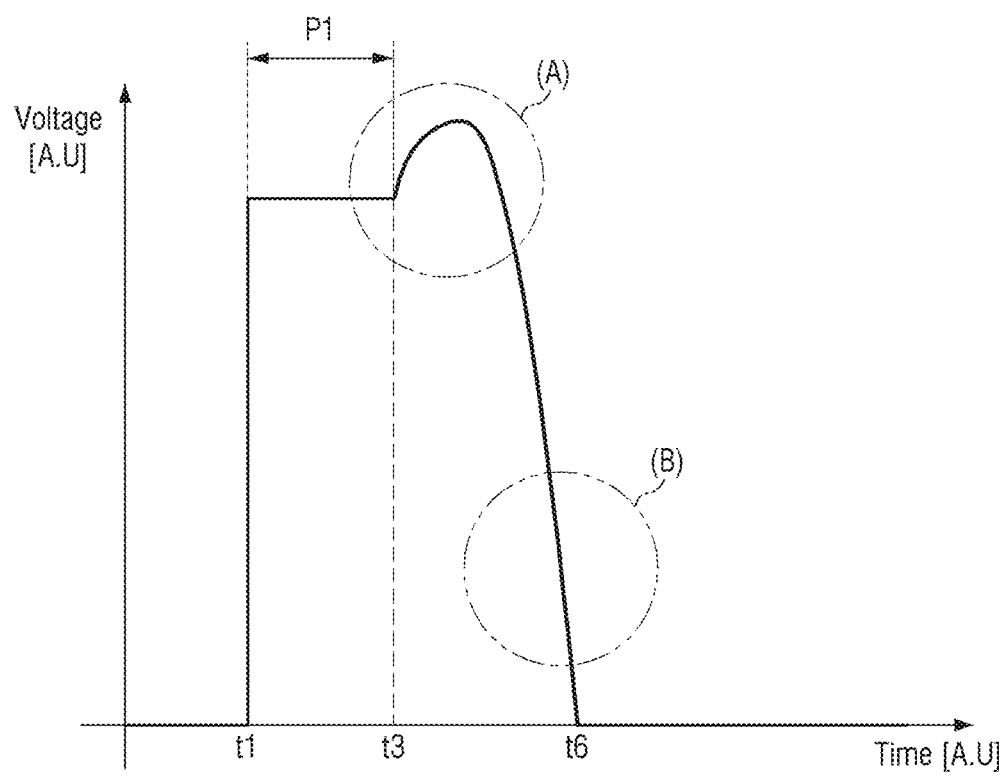
FIG. 6 is an example graph for illustrating voltage generated in the chamber in the plasma etching apparatus according to some embodiments.

FIG. 6 is an example graph for illustrating voltage generated in the chamber in the plasma etching apparatus according to some embodiments.

Referring to FIG. 1, FIG. 3, and FIG. 6, the controller 700 in the plasma etching apparatus 10 according to some embodiments ramps down the first low-frequency RF power 512 for the duration from the third time t3 to the sixth time t6 such that the voltage generated in the chamber 100 may have instantaneous overshooting (A) after the third time t3.

Thereafter, after the voltage generated in the chamber 100 has the instantaneous overshooting after the third time t3, the voltage may gradually decrease (B) until a timing reaches the sixth time t6.

Thus, the clogging phenomenon that may occur during the etching process using the plasma etching apparatus 10 according to some embodiments may be limited and/or prevented. This will be described at in detail with reference to FIG. 7.

Figure 7:
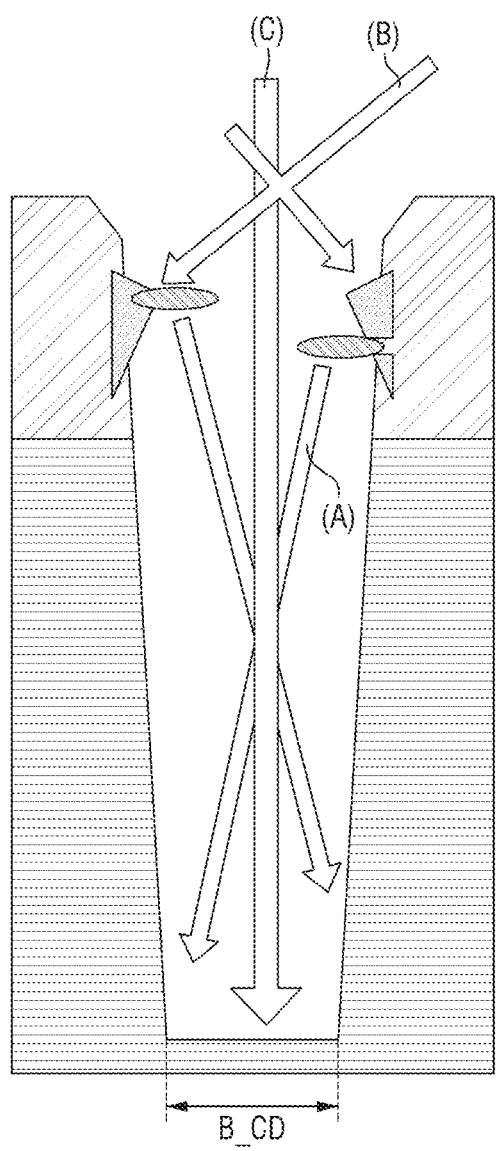
FIG. 7 is an example view for illustrating a portion of an etching process using the plasma etching apparatus according to some embodiments.

FIG. 7 is an example view for illustrating a portion of an etching process using the plasma etching apparatus according to some embodiments.

Referring to FIG. 1, FIG. 6, and FIG. 7, when the plasma etching apparatus 10 according to some embodiments performs the process of etching the substrate W, the process gas 202 may be injected to the chamber along a straight path C.

In this connection, floating particles generated during the etching process may move toward a location from which the process gas 202 is injected, and thus may accumulate at an inlet through which the process gas 202 is injected during the etching process. Thus, the clogging may occur.

However, as the voltage generated in the chamber 100 instantaneously overshoots after the third time t3, the process gas 202 may move along the overshooting path A such that the process gas 202 having increased ion energy may etch a deeper portion of the substrate W, thereby increasing the etch rate. Further, the aspect ratio may be increased.

In this connection, the process gas 202 may move along the path B along which the voltage gradually decreases until the timing reaches the sixth time t6 after the voltage generated in the chamber 100 instantaneously overshoots after the third time t3. Thus, the process gas 202 may be injected toward a wider etching target region of the substrate W, thereby removing the floating particles accumulated at the inlet through which the process gas 202 is injected. Thus, the clogging phenomenon may be eliminated.

Referring back to FIG. 3, the plasma etching apparatus 10 according to some embodiments independently controls the time periods for which the first high-frequency RF power 510, the first low-frequency RF power 512, and the second low-frequency RF power 530 having different frequencies are ramped down, respectively, thereby controlling an etch rate of an edge of the substrate W. This will be described with reference to FIG. 8.

Figure 8:
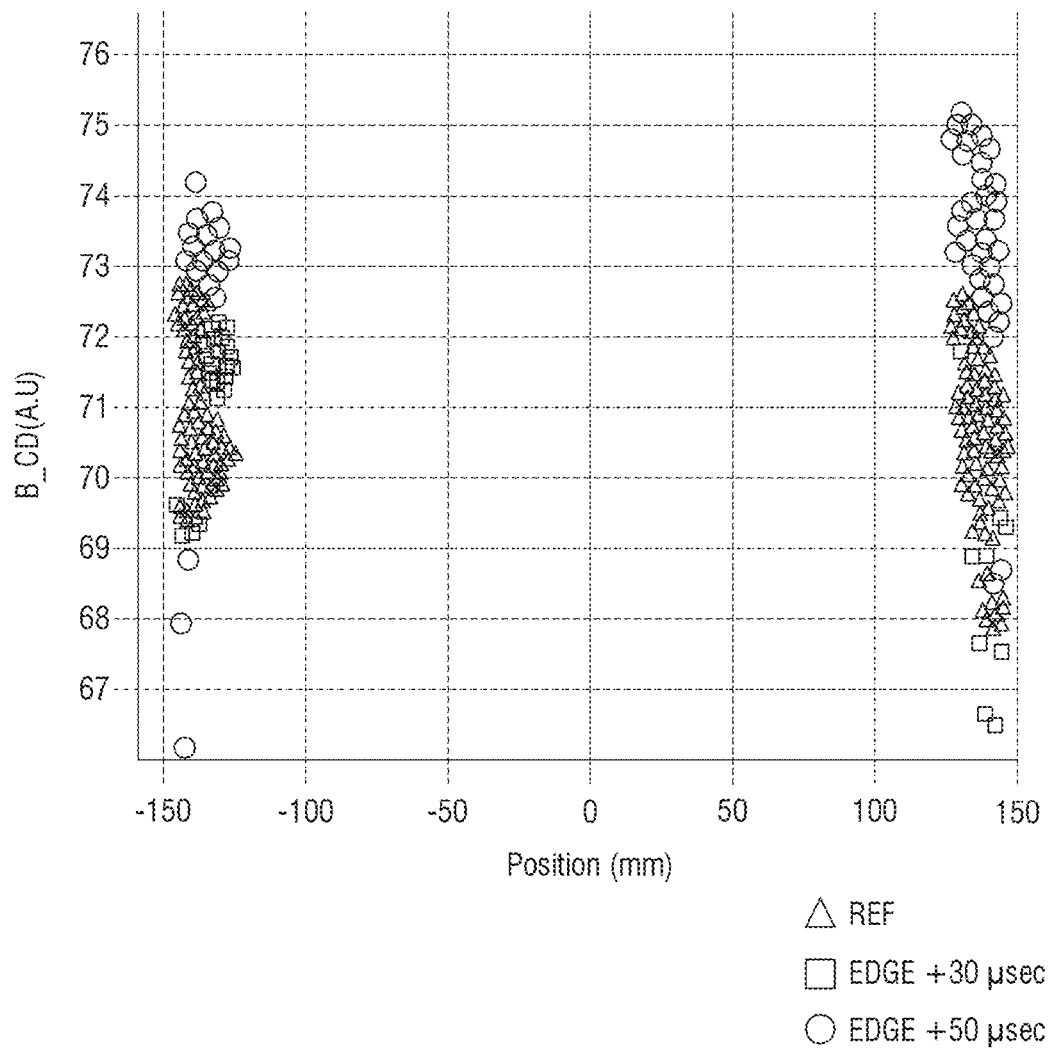
FIG. 8 is an example graph for illustrating a line width distribution of a bottom of an edge of a substrate as generated via an etching process using the plasma etching apparatus according to some embodiments.

FIG. 8 is an example graph for illustrating a line width distribution of a bottom of an edge of a substrate as generated via an etching process using the plasma etching apparatus according to some embodiments.

Referring to FIG. 1, FIG. 3, FIG. 7 and FIG. 8, a case in which the fourth time period P4 from the third time t3 to the fifth time t5 for which the controller 700 of the plasma etching apparatus 10 according to some embodiments ramps down the second low-frequency RF power 530 is defined as a reference REF will be described.

It may be identified that as the time period P4 for which the controller 700 ramps down the second low-frequency RF power 530 is larger, the line width distribution of the bottom B_CD of the edge of the substrate W as etched becomes wider.

For example, it may be identified that when the time period P4 for which the controller 700 ramps down the second low-frequency RF power 530 increases from the REF to the REF+30 usec, the line width distribution of the bottom B_CD of the edge of the substrate W as etched becomes wider than that when the time period P4 for which the controller 700 ramps down the second low-frequency RF power 530 is the REF.

In another example, it may be identified that when the time period P4 for which the controller 700 ramps down the second low-frequency RF power 530 increases from the REF to the REF+50 usec, the line width distribution of the bottom B_CD of the edge of the substrate W as etched becomes wider than that when the time period P4 for which the controller 700 ramps down the second low-frequency RF power 530 increases from the REF to the REF+30 usec.

Based on a following Relationship (2), an absolute value of a difference between the fourth period P4 and the third period P3 is smaller than 0.3 times the first period P1 and is greater than the second period P2.

$$P1*0.3>|P4-P3|>P2 \qquad \text{Relationship (2)}$$

Figure 9:
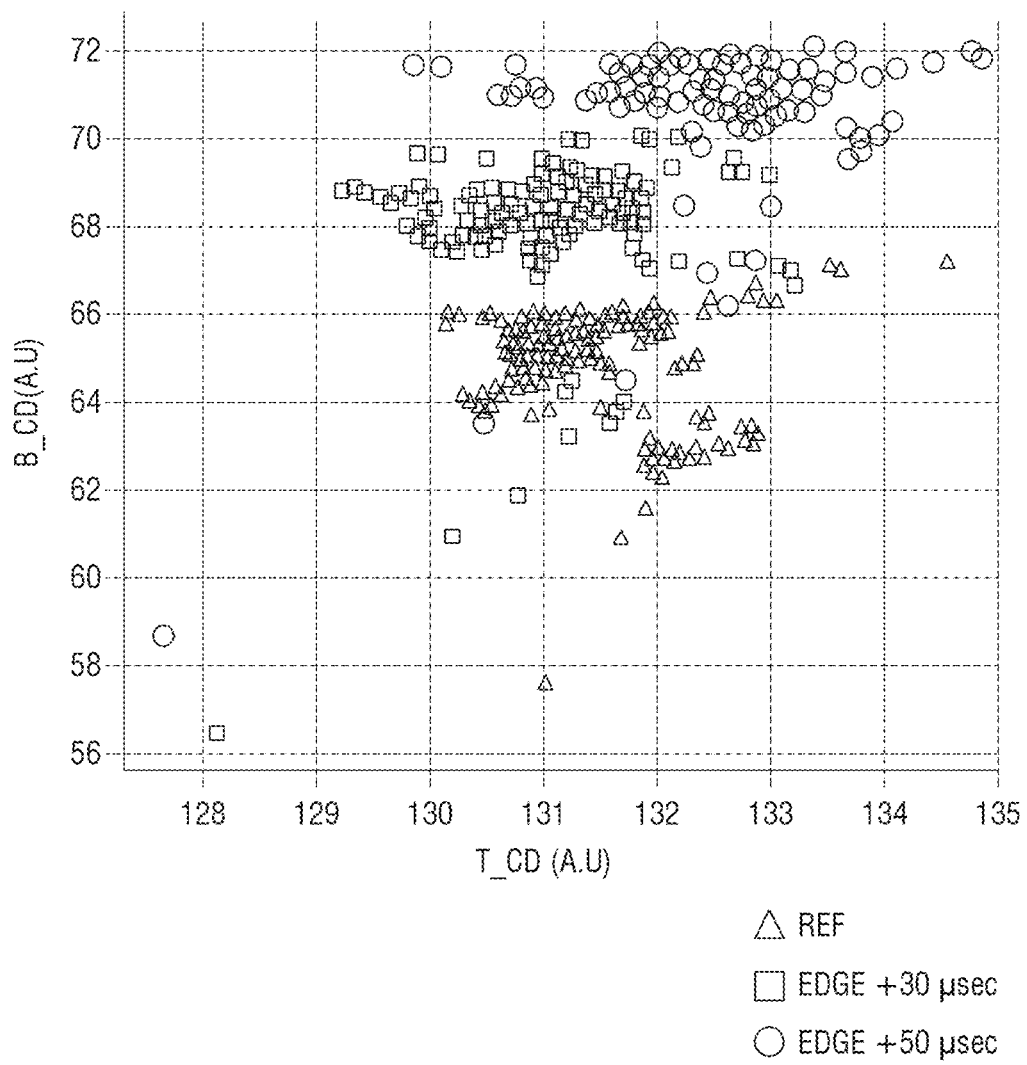
FIG. 9 is an example graph for illustrating a line width distribution of each of a top and a bottom of an edge of a substrate as generated via an etching process using the plasma etching apparatus according to some embodiments.

FIG. 9 is an example graph for illustrating a line width distribution of each of a top and a bottom of an edge of a substrate as generated via an etching process using the plasma etching apparatus according to some embodiments.

Referring to FIG. 1, FIG. 3, and FIG. 9, it is assumed that the first period P1 is 126 us.

In the graph of FIG. 9, a case in which a difference between the third period P3 and the fourth time period P4 from the third time t3 to the fifth time t5 for which the controller 700 of the plasma etching apparatus 10 according to some embodiments ramps down the second low-frequency RF power 530 is defined as a reference REF will be described.

When the difference between the fourth period P4 and the third period P3 is REF, the line width distribution of the top (T_CD) and that of the bottom (B_CD) of the substrate formed during the process are shown. Further, when the difference between the fourth period P4 and the third period P3 is REF+30 us, the line width distribution of the top (T_CD) and that of the bottom (B_CD) of the substrate formed during the process are shown. Further, when the difference between the fourth period P4 and the third period P3 is REF+50 us, the line width distribution of the top (T_CD) and that of the bottom (B_CD) of the substrate formed during the process are shown.

In this connection, it may be identified that when the difference between the fourth period P4 and the third period P3 is REF+30 us, the line width distribution of the bottom (B_CD) relative to that of the top (T_CD) of the substrate formed during the process is narrower than that when the difference is the REF.

However, it may be identified that when the difference between the fourth period P4 and the third period P3 is REF+50 us, which is greater than 0.3 times the first period P0, the line width distribution of the bottom (B_CD) relative to that of the top (T_CD) of the substrate formed during the process is wider than that when the difference is the REF.

Therefore, based on the Relationship 2, the absolute value of the difference between the fourth period P4 and the third period P3 may be set to be smaller than 0.3 times the first period P1 and larger than the second period P2.

Figure 10:
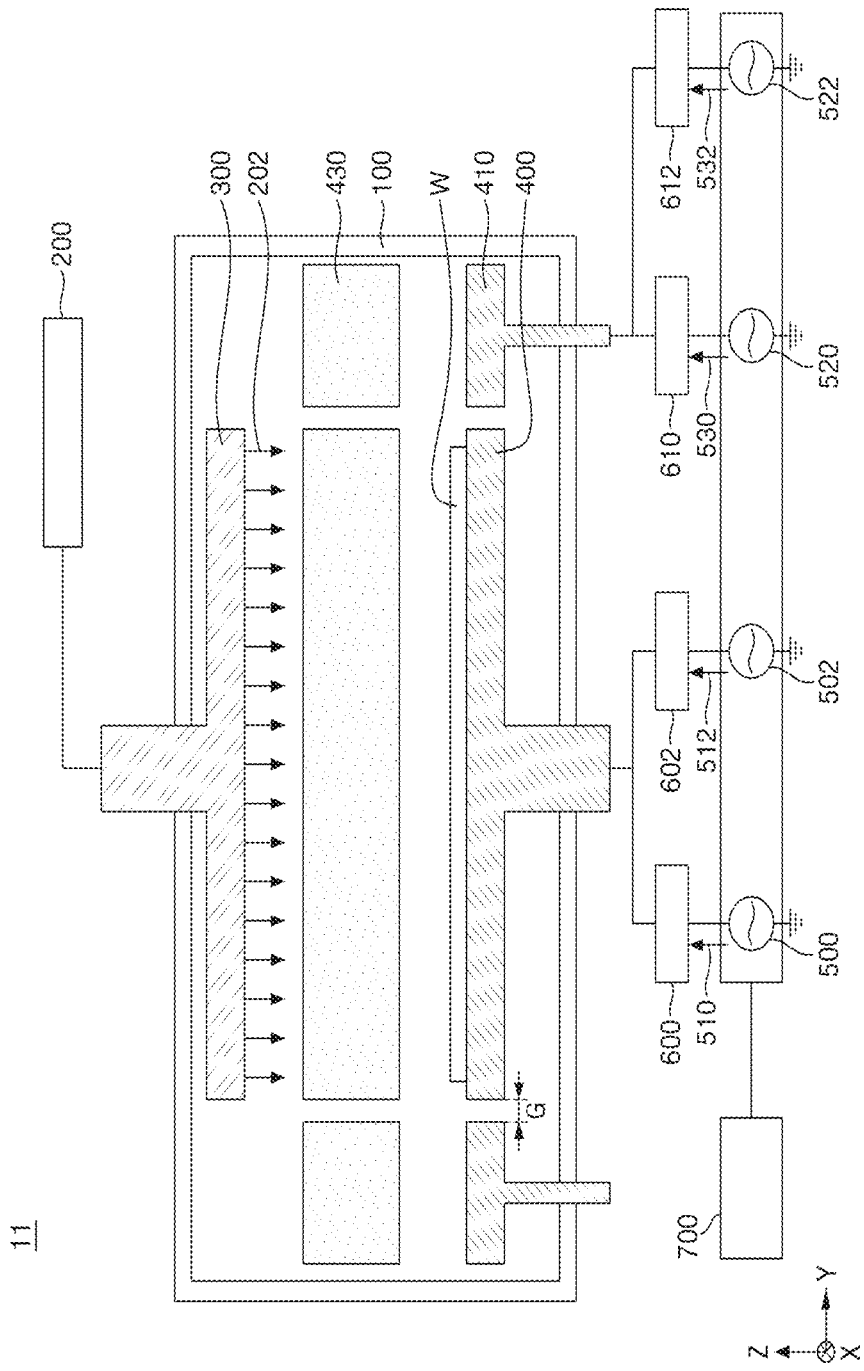
FIG. 10 is an example diagram for illustrating another plasma etching apparatus according to some embodiments.

FIG. 10 is an example diagram for illustrating another plasma etching apparatus according to some embodiments.

Referring to FIG. 10, another plasma etching apparatus 11 according to some embodiments is different from the plasma etching apparatus 10 of FIG. 1 in that a second source electrode 612 connected to the second electrostatic chuck 410, and a fourth RF matcher 612 are further included therein.

The second source electrode 612 and the second bias electrode 520 may be electrically connected to the second electrostatic chuck 410.

The second source electrode 612 and the second bias electrode 520 may supply RF power to the second electrostatic chuck 410.

For example, the second source electrode 612 and the second bias electrode 520 may supply RF power of a pulse waveform to the second electrostatic chuck 410.

The second source electrode 612 and the second bias electrode 520 may supply the RF power to the second electrostatic chuck 410 to allow the plasma 430 to be generated on the substrate W. More specifically, the second source electrode 612 may generate a second high-frequency RF power 532, and the second bias electrode 520 may generate the second low-frequency RF power 530 having a frequency lower than that of the second high-frequency RF power.

The plasma 430 may be generated on the second electrostatic chuck 410 when the second source electrode 612 applies the second high-frequency RF power 532 to the second electrostatic chuck 410. The frequency of the second high-frequency RF power 532 may be about 60 MHz. Alternatively, the frequency of the second high-frequency RF power 532 may be a very high frequency (VHF) in a range of 60 MHz to several hundred MHz.

The second bias electrode 520 may apply the second low-frequency RF power 530 to the second electrostatic chuck 410 such that the plasma 430 generated on the second electrostatic chuck 410 is distributed on the second electrostatic chuck 410 in a concentrated manner. The frequency of the second low-frequency RF power 530 is lower than that of the second high-frequency RF power 532. For example, the frequency of the second low-frequency RF power 530 may be about 400 kHz. Alternatively, the frequency of the second low-frequency RF power 530 may be a low-frequency (LF) in a range of 0.1 MHz to 13.56 MHz.

The fourth RF matcher 612 may detect the reflective power from the second electrostatic chuck 410 and match impedance of the second high-frequency RF power 532 with the impedance of the plasma 430 in the chamber 100 to remove the reflective power from the second electrostatic chuck 410. The impedance of plasma 430 may include the impedances of the chamber 100, the second electrostatic chuck 410, and the connecting cable (not shown) connecting the chamber 100 and the second electrostatic chuck 410 to each other. When the impedance of the second high-frequency RF power 532 and the impedance of the plasma 430 match each other, the generating efficiency of the plasma 430 may be increased to the maximum level without loss of the second high-frequency RF power 532.

The controller 700 may control the first source electrode 500, the first bias electrode 502, the second source electrode 612, and the second bias electrode 520. More specifically, the controller 700 may control on or off of the first high-frequency RF power 510 generated from the first source electrode 500, control on or off of the first low-frequency RF power 512 generated from the first bias electrode 502, control on or off of the second high-frequency RF power 532 generated from the second source electrode 612, and control on or off of the second low-frequency RF power 530 generated from the second bias electrode 520.

That is, the controller 700 of the plasma etching apparatus 11 according to some embodiments independently controls on or off of the first high-frequency RF power 510, on or off of the first low-frequency RF power 512, on or off of the second high-frequency RF power 532, and on or off of the second low-frequency RF power 530, such that in a process of manufacturing a semiconductor device on the substrate W, etching performance may be controlled in a desired direction. For example, the etching performance in the process of manufacturing the semiconductor device on the substrate W may be improved to perform an etching process with an improved aspect ratio.

Figure 11:
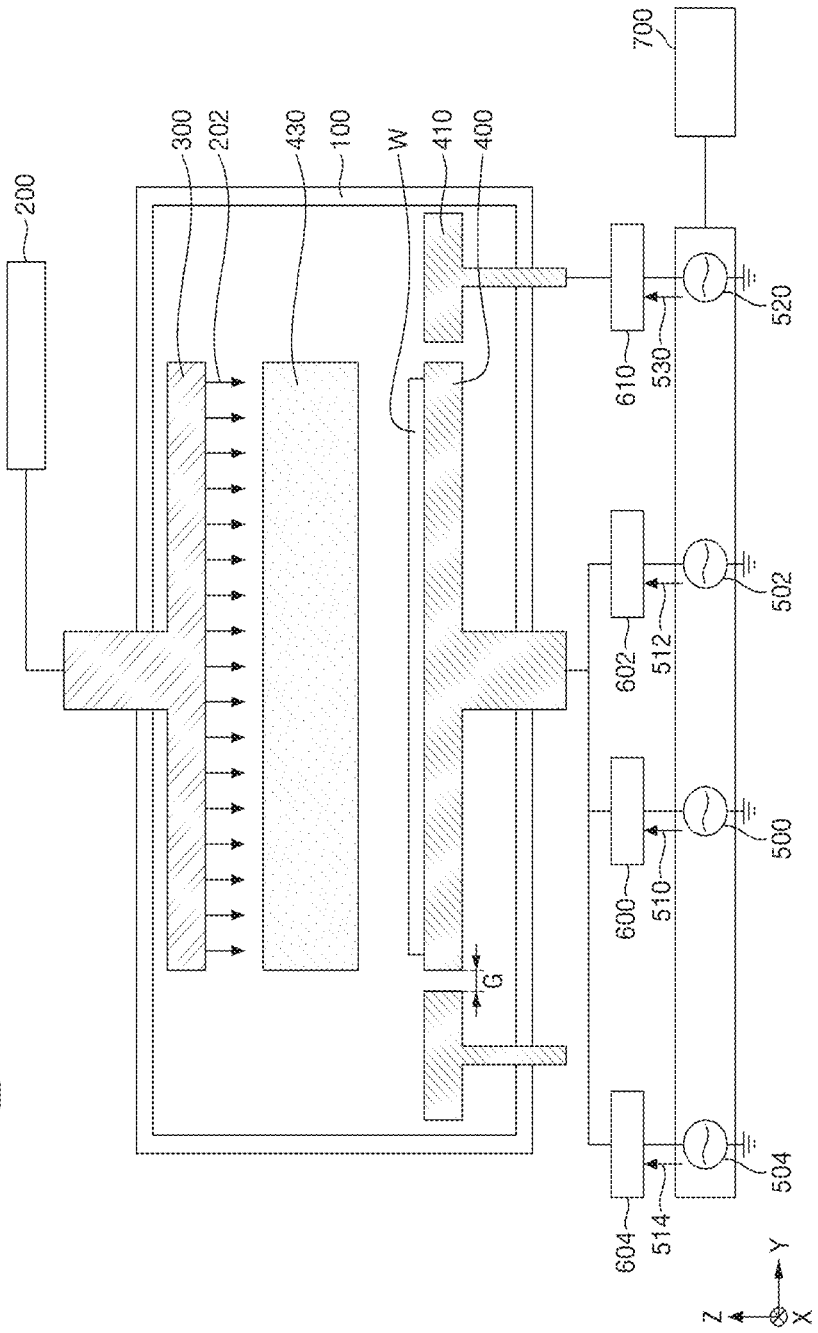
FIG. 11 is an example view for illustrating still another plasma etching apparatus according to some embodiments.

FIG. 11 is an example view for illustrating still another plasma etching apparatus according to some embodiments.

Referring to FIG. 11, still another plasma etching apparatus 12 according to some embodiments is different from the plasma etching apparatus 10 of FIG. 1 in that a third bias electrode 504 connected to the first electrostatic chuck 400, and a fifth RF matcher 604 are further included therein.

The third bias electrode 504 may supply RF power to the first electrostatic chuck 400. For example, the third bias electrode 504 may supply RF power of a pulse waveform to the first electrostatic chuck 400.

A frequency of an intermediate RF power 514 provided from the third bias electrode 504 to the first electrostatic chuck 400 may be lower than a frequency of the first high-frequency RF power 510 and higher than the frequency of the first low-frequency RF power 512.

The fifth RF matcher 604 may detect the reflective power from the first electrostatic chuck 400 and match impedance of the intermediate RF power 514 with that of the plasma 430 in the chamber 100 to remove the reflective power from the first electrostatic chuck 400. The impedance of plasma 430 may include the impedances of the chamber 100, the first electrostatic chuck 400, and the connecting cable (not shown) connecting the chamber 100 and the first electrostatic chuck 400 to each other. When the impedance of the intermediate RF power 514 and the impedance of the plasma 430 match each other, the generating efficiency of the plasma 430 may be increased to the maximum level without loss of the intermediate RF power 514.

The controller 700 may control the first source electrode 500, the first bias electrode 502, the third bias electrode 504, and the second bias electrode 520. More specifically, the controller 700 may control on or off of the first high-frequency RF power 510 generated from the first source electrode 500, control on or off of the first low-frequency RF power 512 generated from the first bias electrode 502, control on or off of the intermediate RF power 514 generated from the third bias electrode 504 and control on or off of the second low-frequency RF power 530 generated from the second bias electrode 520.

That is, the controller 700 of the plasma etching apparatus 12 according to some embodiments may independently control on or off of the first high-frequency RF power 510, on or off of the first low-frequency RF power 512, on or off of the intermediate RF power 514, and on or off of the second low-frequency RF power 530, such that etching performance may be controlled in a desired direction. For example, the etching performance in the process of manufacturing the semiconductor device on the substrate W may be improved to perform an etching process with an improved aspect ratio.

FIG. 12 is an example flowchart for illustrating a method for operating a plasma etching apparatus according to some embodiments.

Referring to FIG. 1, FIG. 3 and FIG. 12, the method includes placing the substrate W on the first electrostatic chuck 400 in S100.

Then, the method includes placing the second electrostatic chuck 410 around the edge of the first electrostatic chuck 400 so as to surround the first electrostatic chuck in S110.

In this connection, the operation S100 of placing the substrate W on the first electrostatic chuck 400 and the operation S120 of placing the second electrostatic chuck 410 around the edge of the first electrostatic chuck may be carried out in parallel with each other, or may be exchanged with each other. In some embodiments, S120 may be done before S100.

Thereafter, the controller 700 may supply the first high-frequency RF power 510 to the first electrostatic chuck 400 via the first source electrode 500 electrically connected to the first electrostatic chuck 400 in S120.

Further, the controller 700 may supply the first low-frequency RF power 512 with a lower frequency than that of the first high-frequency RF power 510 to the first electrostatic chuck 400 via the first bias electrode 502 electrically connected to the first electrostatic chuck 400 in S130.

Further, the controller 700 may supply the second low-frequency RF power 530 having a lower frequency than that of the first high-frequency RF power 510 to the second electrostatic chuck 410 via the second bias electrode 520 electrically connected to the second electrostatic chuck 410 in S140.

In this connection, a sequence of the operation S120 in which the first high-frequency RF power 510 is supplied to the first electrostatic chuck 400, the operation S130 in which the first low-frequency RF power 512 is supplied to the first electrostatic chuck 400, and the operation S140 in which the second low-frequency RF power 530 is supplied to the second electrostatic chuck 410 is not limited to this drawing. Alternatively, the operations S120 to S140 may be performed in parallel with each other, or may be exchanged with each other.

In this connection, the first high-frequency RF power 510, the first low-frequency RF power 512, and the second low-frequency RF power 530 may be controlled by the controller 700 controlling the first bias electrode 502 and the second bias electrode 520.

More specifically, the supplies of the first high-frequency RF power 510, the first low-frequency RF power 512 and the second low-frequency RF power 530 may be performed for the first period P1 from the first time t1 to the third time t3. Further, the first high-frequency RF power 510 may be ramped down and turned off for (e.g., in or during) the second period P2 from the third time t3 to the fourth time t4.

In this connection, the first low-frequency RF power 512 may be ramped down and turned off for (e.g., in or during) the third period P3 from the third time t3 to the sixth time t6 different from the third time t3.

In this connection, the third period P3 is smaller than ½ times the first period P1 and greater than the second period according to the above Relationship (1).

Further, the controller 700 may ramp down and turn off the second low-frequency RF power 530 for (e.g., in or during) the fourth period P4 from the third time t3 to the fifth time t5 different from the sixth time t6.

In this connection, the controller 700 may set the absolute value of the difference between the fourth period P4 and the third period P3 to be smaller than 0.3 times the first period P1 and greater than the second period P2 based on the above Relationship (2).

In another example, referring to FIG. 3, FIG. 10, and FIG. 12, the controller 700 may supply the second high-frequency RF power 532 to the second electrostatic chuck 410 via the second source electrode 522 electrically connected to the second electrostatic chuck 410.

In still another example, referring to FIG. 3, FIG. 11, and FIG. 12, the controller 700 may supply the intermediate RF power 514 having a frequency lower than that of the first high-frequency RF power 510 and higher than that of the first low-frequency RF power 512 to the first electrostatic chuck 400 via the third bias electrode 504 electrically connected to the first electrostatic chuck 400.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Although embodiments of the present disclosure have been described above with reference to the accompanying drawings, it will be understood by those of ordinary skill in the art that the present disclosure is not limited thereto and may be implemented in many different forms without departing from spirt and scope of inventive concepts. Therefore, it should be understood that the embodiments set forth herein are merely examples in all respects and not restrictive.

What is claimed is:

1. A plasma etching apparatus comprising:
a first electrostatic chuck configured to support a substrate;
a second electrostatic chuck around an edge of the first electrostatic chuck and surrounding the first electrostatic chuck;
a first source electrode electrically connected to the first electrostatic chuck and configured to supply a first high-frequency RF power thereto;
a first bias electrode electrically connected to the first electrostatic chuck and configured to supply a first low-frequency RF power thereto, wherein a frequency of the first low-frequency RF power is lower than a frequency of the first high-frequency RF power;
a second bias electrode electrically connected to the second electrostatic chuck and configured to supply a second low-frequency RF power thereto, wherein a frequency of the second low-frequency RF power is lower than the frequency of the first high-frequency RF power; and
a controller configured to control the first source electrode, the first bias electrode, and the second bias electrode, wherein
the controller is configured to supply the first high-frequency RF power to the first source electrode, the first low-frequency RF power to the first bias electrode, and the second low-frequency RF power to the second bias electrode during a first period from a first time to a second time,
the controller is configured to ramp down and turn off the first high-frequency RF power to the first source electrode during a second period from the second time to a third time,
the controller is configured to ramp down and turn off the first low-frequency RF power to the first bias electrode during a third period from the second time to a fourth time different from the third time,
the second time is after the first time,
the third time is after the second time,
the fourth time is after the third time,
the third period is smaller than ½ times the first period, and
the third period is larger than the second period.

2. The plasma etching apparatus of claim 1, wherein the first electrostatic chuck and the second electrostatic chuck are spaced apart from each other.

3. The plasma etching apparatus of claim 1, wherein
the controller is configured to ramp down and turn off the second low-frequency RF power to the second bias electrode during a fourth period P4 from the second time to a fifth time different from the fourth time, and
the fifth time is after the fourth time.

4. The plasma etching apparatus of claim 3, wherein an absolute value of a difference between the fourth period and the third period is smaller than 0.3 times the first period and is greater than the second period.

5. The plasma etching apparatus of claim 4, wherein
the controller is configured to ramp down the second low-frequency RF power to the second bias electrode during the fourth period.

6. The plasma etching apparatus of claim 1, further comprising:
a second source electrode electrically connected to the second electrostatic chuck and configured to supply a second high-frequency RF power thereto, wherein
a frequency of the second high-frequency RF power is higher than a frequency of the second low-frequency RF power.

7. The plasma etching apparatus of claim 1, further comprising:
a third bias electrode electrically connected to the first electrostatic chuck and configured to supply an intermediate frequency RF power thereto, wherein
a frequency of the intermediate frequency RF power is lower than the frequency of the first high-frequency RF power and higher than the frequency of the first low-frequency RF power.

8. The plasma etching apparatus of claim 1, wherein
the controller is configured to ramp down the first high-frequency RF power to the first source electrode during the second period; and
the controller is configured to ramp down the first low-frequency RF power to the first bias electrode during the third period.

9. A plasma etching apparatus comprising:
a chamber having an internal space defined therein;
a first source electrode, a first bias electrode, and a second bias electrode configured to generate a plasma by supplying energy to a process gas injected into the internal space of the chamber; and
a controller configured to control a first high-frequency RF power supplied from the first source electrode to the chamber, a first low-frequency RF power supplied from the first bias electrode to the chamber and having a frequency that is lower than a frequency of the first high-frequency RF power, and a second low-frequency RF power supplied from the second bias electrode to chamber and having a frequency that is lower than the frequency of the first high-frequency RF power, wherein
the controller is configured to supply the first high-frequency RF power, the first low-frequency RF power, and the second low-frequency RF power to the chamber during a first period from a first time to a second time;
the controller is configured to ramp down and turn off the first high-frequency RF power to the chamber during a second period from the second time to a third time,
the controller is configured to ramp down and turn off the first low-frequency RF power to the chamber during a third period from the second time to a fourth time different from the third time,
the second time is after the first time,
the third time is after the second time,
the fourth time is after the third time,
the third period is smaller than ½ times the first period, and
the third period is greater than the second period.

10. The plasma etching apparatus of claim 9, further comprising:
a first electrostatic chuck and a second electrostatic chuck in the chamber and spaced apart from each other.

11. The plasma etching apparatus of claim 10, further comprising:
a second source electrode electrically connected to the second electrostatic chuck and configured to supply a second high-frequency RF power thereto, wherein
a frequency of the second high-frequency RF power is higher than a frequency of the second low-frequency RF power.

12. The plasma etching apparatus of claim 9, wherein
the controller is configured to ramp down and turn off the second low-frequency RF power to chamber during a fourth period from the second time to a fifth time different from the fourth time, and
the fifth time is after the fourth time.

13. The plasma etching apparatus of claim 12, wherein an absolute value of a difference between the fourth period and the third period is smaller than 0.3 times the first period and is greater than the second period.

14. The plasma etching apparatus of claim 12, wherein the controller is configured to ramp down the second low-frequency RF power to chamber during the fourth period.

15. The plasma etching apparatus of claim 9, further comprising:
a first electrostatic chuck in the chamber;
a third bias electrode electrically connected to the first electrostatic chuck and configured to supply an intermediate frequency RF power thereto, wherein
a frequency of the intermediate frequency RF power is lower than the frequency of the first high-frequency RF power and higher than the frequency of the first low-frequency RF power.

16. The plasma etching apparatus of claim 9, wherein the controller is configured to:
ramp down the first high-frequency RF power to chamber during the second period; and
ramp down the first low-frequency RF power to the chamber during the third period.

17. A method for operating a plasma etching apparatus, the method comprising:
placing a substrate on a first electrostatic chuck;
placing a second electrostatic chuck around an edge of the first electrostatic chuck so the second electrostatic chuck surrounds the first electrostatic chuck;
supplying a first high-frequency RF power to the first electrostatic chuck via a first source electrode electrically connected to the first electrostatic chuck;
supplying a first low-frequency RF power via a first bias electrode electrically connected to the first electrostatic chuck, wherein a frequency of the first low-frequency RF power is lower than a frequency of the first high-frequency RF power;
supplying a second low-frequency RF power to the second electrostatic chuck via a second bias electrode electrically connected to the second electrostatic chuck, wherein a frequency of the second low-frequency RF power is lower than the frequency of the first high-frequency RF power;
controlling, by a controller, the first source electrode, the first bias electrode, and the second bias electrode, such that
the first high-frequency RF power is supplied to the first source electrode, the first low-frequency RF power is supplied to the first bias electrode, and the second low-frequency RF power is supplied to the second bias electrode during a first period from a first time to a second time,
the first high-frequency RF power to the first source electrode is ramped down and turned off during a second period from the second time to a third time, and
the first low-frequency RF power to the first bias electrode is ramped down and turned off during a third period from the second time to a fourth time different from the third time, wherein the second time is after the first time, the third time is after the second time, the fourth time is after the third time, the third period is smaller than ½ times the first period, and the third period is greater than the second period.

18. The method of claim 17, wherein the controller controls the second bias electrode such that the second low-frequency RF power to the second bias electrode is ramped down and turned off during a fourth period from the second time to a fifth time different from the fourth time, and the fifth time is after the fourth time.

19. The method of claim 18, wherein an absolute value of a difference between the fourth period and the third period is smaller than 0.3 times the first period and is greater than the second period.

20. The method of claim 17, further comprising:

supplying a second high-frequency RF power to the second electrostatic chuck via a second source electrode electrically connected to the second electrostatic chuck, wherein a frequency of the second high-frequency RF power is higher than a frequency of the second low-frequency RF power.

* * * * *